(12) United States Patent
Garg et al.

(10) Patent No.: US 8,008,961 B2
(45) Date of Patent: Aug. 30, 2011

(54) ADAPTIVE CLOCK GENERATORS, SYSTEMS, AND METHODS

(75) Inventors: Manish Garg, Morrisville, NC (US);
Chiaming Chai, Chapel Hill, NC (US);
Jeffrey Todd Bridges, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/637,321

(22) Filed: Dec. 14, 2009

(65) Prior Publication Data

US 2011/0140752 A1 Jun. 16, 2011

(51) Int. Cl.
*H03K 3/00* (2006.01)
(52) U.S. Cl. .......................... 327/291; 327/293; 327/299
(58) Field of Classification Search .......... 327/263–264, 327/276–278, 284, 291, 293–294, 299
See application file for complete search history.

(56) References Cited

U.S. PATENT DOCUMENTS

| | | | | |
|---|---|---|---|---|
| 5,727,021 A | * | 3/1998 | Truebenbach | 375/226 |
| 6,046,620 A | * | 4/2000 | Relph | 327/277 |
| 6,795,931 B1 | * | 9/2004 | LaBerge | 713/401 |
| 7,535,274 B2 | * | 5/2009 | Ong et al. | 327/158 |
| 2006/0186938 A1 | | 8/2006 | Cao | |
| 2008/0100365 A1 | * | 5/2008 | Kaizuka | 327/291 |
| 2008/0256503 A1 | | 10/2008 | Goodnow et al. | |

FOREIGN PATENT DOCUMENTS

WO WO2010058249 A1 5/2010

OTHER PUBLICATIONS

International Search Report and Written Opinion—PCT/US2010/060361—ISA/EPO—May 23, 2011.

* cited by examiner

*Primary Examiner* — An T Luu
(74) *Attorney, Agent, or Firm* — Peter M. Kamarchik; Nicholas J. Pauley; Jonathan T. Velasco

(57) ABSTRACT

Adaptive clock generators, systems, and related methods than can be used to generate a clock signal for a functional circuit to avoid or reduce performance margin are disclosed. In certain embodiments, a clock generator autonomously and adaptively generates a clock signal according to a delay path(s) provided in a delay circuit(s) relating to a selected delay path(s) in the functional circuit(s). The clock generator includes a delay circuit(s) adapted to receive an input signal and delay the input signal by an amount relating to a delay path(s) of a functional circuit(s) to produce an output signal. A feedback circuit is coupled to the delay circuit(s) and responsive to the output signal, wherein the feedback circuit is adapted to generate the input signal back to the delay circuit(s) in an oscillation loop configuration. The input signal can be used to provide a clock signal to the functional circuit(s).

23 Claims, 9 Drawing Sheets

ADAPTIVE CLOCK GENERATORS, SYSTEMS, AND METHODS

BACKGROUND

I. Field of the Disclosure

The technology of the disclosure relates generally to clock generators and related circuits, systems, and methods that provide a clock signal to circuits, including but not limited to synchronous digital circuits.

II. Background

Synchronous digital circuits, such as central processing units (CPUs) or digital signal processors (DSPs) as examples, require a clock signal to coordinate timing of logic in the circuit. The frequency of the clock signal controls the switching speed or rate of the logic and thus the performance of the circuit. While it is generally desired to maximize performance by maximizing the frequency of the clock signal, synchronous digital circuits have maximum performance rates beyond which they will not operate properly. Thus, the frequency of the clock signal is controlled to operate within maximum frequency guidelines according to the performance of the components included in the circuit. A crystal oscillator may be employed to generate a fixed frequency clock signal supplied to synchronous digital circuits accordingly. Alternatively, a frequency-locked loop (FLL) or phase-locked loop (PLL) controller may be employed to provide a fixed frequency clock signal to synchronous digital circuits.

Ideally, the frequency of the clock signal would be set to the maximum performance rate of the circuit. However, in operation, the maximum performance rates of synchronous digital circuits and their components can vary and be lowered from ideal rates depending on a variety of conditions, which lead to performance loss. For example, variability in nanometer integrated circuit (IC) processes used to manufacture synchronous digital circuits and their components can cause delay variations. Environmental conditions, such as operating temperature and aging effect of transistors, can also affect propagation delay. Voltage levels supplied by voltage suppliers can be momentarily lowered due to variations in current draw thus momentarily lowering performance as a result. In this regard, frequency generators are configured to control the maximum frequency of the clock signal according the worst case scenarios of the delay variations to ensure proper circuit operation over all operating conditions. The difference between the ideal maximum frequency and the worst case frequency of the clock signal to account for worst case delay variations during operation is known as clock rate margin or frequency margin. While lowering the maximum frequency of the clock signal can ensure proper operation of a circuit under delay variation conditions, frequency margin creates performance margin even if worst case delay conditions are not present or not in the circuit at a particular time. Thus, the frequency of the clock signal supplied to the circuit is lower than the maximum performance ability of the circuit at given times, lowering the overall performance of the circuit.

SUMMARY OF THE DISCLOSURE

Embodiments disclosed in the detailed description include adaptive clock generators, systems, and methods that can be employed to generate a clock signal or a signal used to produce a clock signal provided to a circuit. The adaptive clock signal autonomously provides a clock signal or a signal used to provide a clock signal to one or more functional circuits, including but not limited to a synchronous digital circuit. The frequency of the clock signal is adaptively adjusted to correspond to one or more selected delay paths in the functional circuit(s). In this manner, if the amount of delay in a delay path(s) in the functional circuit(s) adjusts, such as due to one or more variation conditions, the clock signal generated by the clock generator adaptively adjusts in response to the change in delay. Thus, the frequency of the clock signal provided or used to provide a clock signal to a functional circuit(s) is adaptively adjusted to the performance (i.e., delay) of the functional circuit(s) to avoid or reduce frequency margin and thus avoid or reduce performance margin while still allowing for proper operation of the functional circuit.

In one embodiment, a clock generator comprises at least one delay circuit adapted to receive an input signal and delay the input signal by an amount relating to at least one delay path of a functional circuit to produce an output signal. The clock generator further comprises a feedback circuit coupled to the at least one delay circuit and responsive to the output signal, wherein the feedback circuit is adapted to generate the input signal.

In another embodiment, a clock generator comprises a means for receiving an input signal, delaying the input signal by an amount relating to at least one delay path of a functional circuit, and for producing an output signal. The clock generator further comprises a means coupled to the means for receiving an input signal and responsive to the output signal for generating the input signal.

In another embodiment, a circuit comprises a clock generator. The clock generator comprises at least one delay circuit adapted to receive an input signal and delay the input signal by an amount relating to at least one delay path of a functional circuit to produce an output signal. The clock generator further comprises a feedback circuit coupled to the at least one delay circuit and responsive to the output signal. The feedback circuit is adapted to generate the input signal. The functional circuit is adapted to receive a clock signal based on the input signal to control timing of one or more synchronous functions.

In another embodiment, a method of providing a clock generator comprises reviewing a plurality of delay paths in a functional circuit. The method further comprises determining an amount of delay in the plurality of delay paths, providing a plurality of delay circuits in a clock generator each configured to correspond to the amount of delay in one of the plurality of delay paths, and configuring the plurality of delay circuits. Configuring the plurality of delay circuits comprises delaying an input signal by an amount relating to the longest delay among the plurality of delay paths, generating an output signal as a result of delaying the input signal, and generating the input signal using a feedback circuit coupled to the plurality of delay circuits and responsive to the output signal.

DETAILED DESCRIPTION

Figure 1:
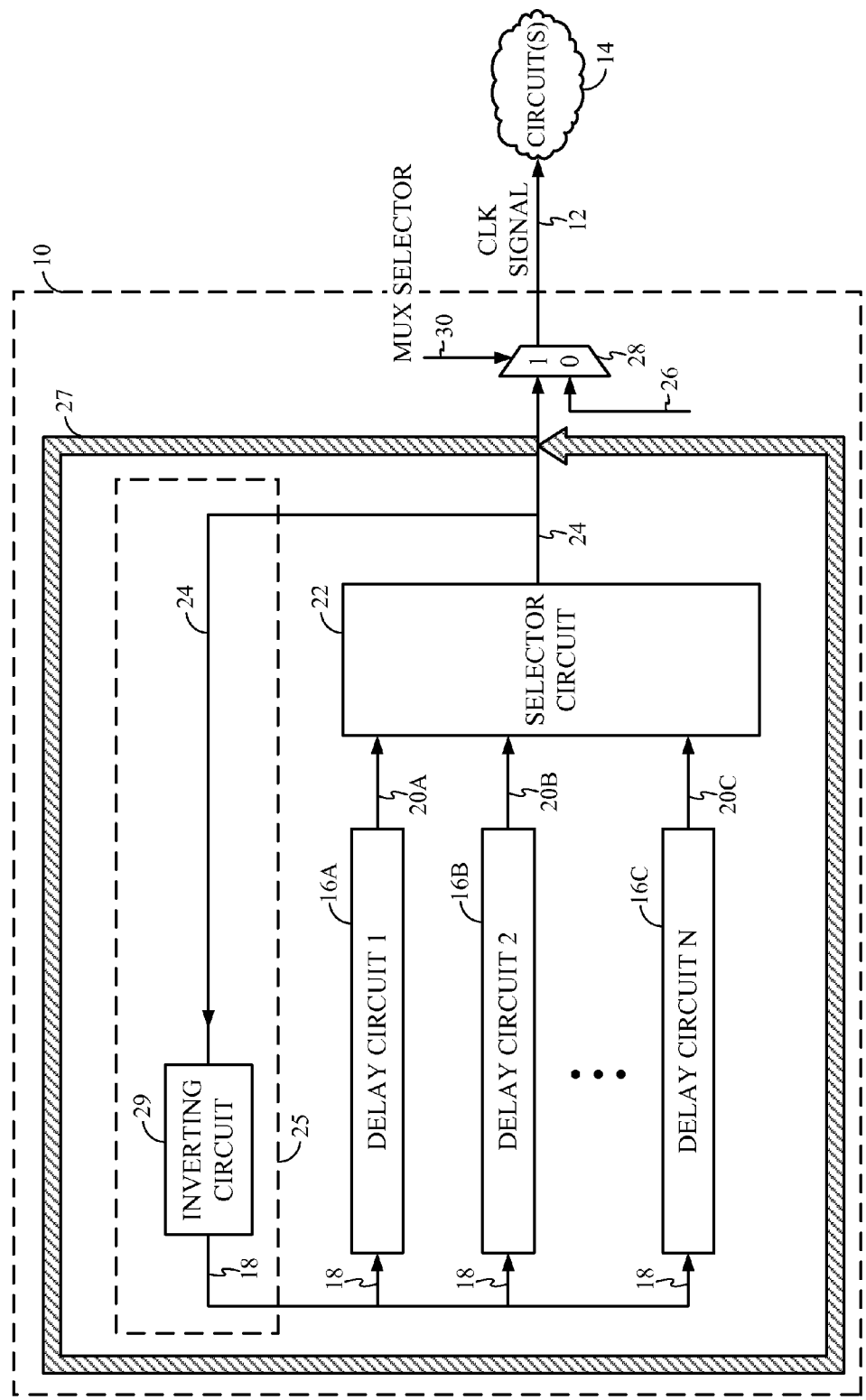
FIG. 1 is a block diagram of an exemplary adaptive clock generator.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include adaptive clock generators, systems, and methods that can be employed to generate a clock signal or a signal used to produce a clock signal provided to a circuit. The adaptive clock signal generator provides a clock signal or a signal used to provide a clock signal to one or more functional circuits, including but not limited to a synchronous digital circuit. The frequency of the clock signal is adaptively adjusted to correspond to one or more selected delay paths in the functional circuit(s). In this manner, if the amount of delay in a delay path(s) in the functional circuit(s) adjusts, such as due to one or more variation conditions, the clock signal generated by the clock generator adaptively adjusts in response to the change in delay. Thus, the frequency of the clock signal provided or used to provide a clock signal to a functional circuit(s) is adaptively adjusted to the performance (i.e., delay) of the functional circuit(s) to avoid or reduce frequency margin and thus avoid or reduce performance margin while still allowing for proper operation of the functional circuit.

In this regard, FIG. 1 illustrates an exemplary adaptive clock generator 10 that can be employed to provide a clock signal 12 to a functional circuit or circuits 14. The functional circuit(s) 14 may be a synchronous digital circuit, as an example. The clock signal 12 controls and synchronizes the activities performed in the functional circuit(s) 14 to account for propagation delays. To adaptively control the frequency of the clock signal 12, which in turn adaptively adjusts the performance of the functional circuit(s) 14, one or more delay circuits 16 are provided in the adaptive clock generator 10. The frequency of the clock signal 12 is adaptively controlled to avoid or reduce performance margin of the functional circuit(s) 14 while not exceeding performance capabilities. The one or more delay circuits 16 each have a delay path configured to correspond to one or more selected delay paths in the functional circuit(s) 14. The selected delay paths may correspond to one or more critical paths in the functional circuit(s) 14. The selected delay paths have associated delays that can increase or decrease based on delay variation conditions thus decreasing or increasing, respectively, the maximum performance capabilities of the functional circuit(s) 14. The delay paths in the delay circuits 16A-16C are configured to respond to the same or similar delay variation conditions that affect delay in the selected delay paths in the functional circuit(s) 14. Thus, the delays in the delay circuits 16A-16C adjust in the same or similar manner to the selected delay paths in the functional circuit(s) 14. As a result, the frequency of the clock signal 12 adaptively adjusts to these delay variation conditions to maximize performance of the functional circuit(s) 14 by avoiding or reducing performance margin without exceeding maximum performance capabilities.

For example, if a selected delay path in the functional circuit(s) 14 increases due to a delay variation condition, the delay in a delay circuit 16 corresponding to the selected delay path will increase, thus decreasing the frequency of the clock signal 12. Similarly, if a selected delay path in the functional circuit(s) 14 decreases due to a delay variation condition, the delay in a delay circuit 16 corresponding to the selected delay path decreases, thus increasing the frequency of the clock signal 12 so long as the new increased frequency does not exceed a maximum frequency. Adaptively controlling the frequency of the clock signal 12 according to delay changes in selected delay paths in the functional circuit(s) 14 avoids or reduces performance margin while also avoiding or operating the functional circuits(s) 14 beyond maximum frequencies. As a result, performance of the functional circuit(s) 14 is maximized according to whatever delay variation conditions are accounted for in the delay circuits 16, which may be present in the functional circuit(s) 14 at any given time.

In this embodiment, a plurality of delay circuits 16A-16C (i.e., DELAY CIRCUITS 1-N) are provided, each receiving an input signal 18 and providing output signals 20A-20C, which are combined in a selector circuit 22. The selector circuit 22 in this embodiment selects the output signal 20A-20C having the greatest delay from the delay circuits 16A-16C to generate an input signal 24 representing worst case delay in this embodiment, which is a feedback signal and variable clock signal in this embodiment. The input signal 24 forms part of a feedback circuit 25. The input signal 24 is used to generate the clock signal 12 provided to the functional circuit(s) 14. In this embodiment, glitch free clock switching is performing by coupling the input signal 24 and a conventional clock signal 26 into a glitch free clock multiplexor 28. The conventional clock signal 26 may be used to operate the functional circuit(s) 14 during initialization before an oscillation loop 27 of the adaptive clock generator 10 is activated and/or running to provide the input signal 24. The output of the glitch free clock multiplexor 28, selected by a selector signal 30, is the clock signal 12 provided to the functional circuit(s) 14.

In this embodiment, the feedback circuit 25 includes an inverting circuit 29 in the signal path between the selector circuit 22 and the delay circuits 16A-16C. The input signal 24 is also coupled to the inverting circuit 29, whose output is the reverse polarity of the input signal 24 and provides the input signal 18 into the delay circuits 16A-16C thereby creating a ring oscillator, as shown by the oscillation loop 27. In this manner, the frequency of the clock signal 12 is continuously, adaptively controlled according to the slowest delay path provided in the delay circuits 16A-16C. The frequency of the clock signal 12 does not have to be fixed based on worst case delay conditions in the functional circuit(s) 14.

Figure 2:
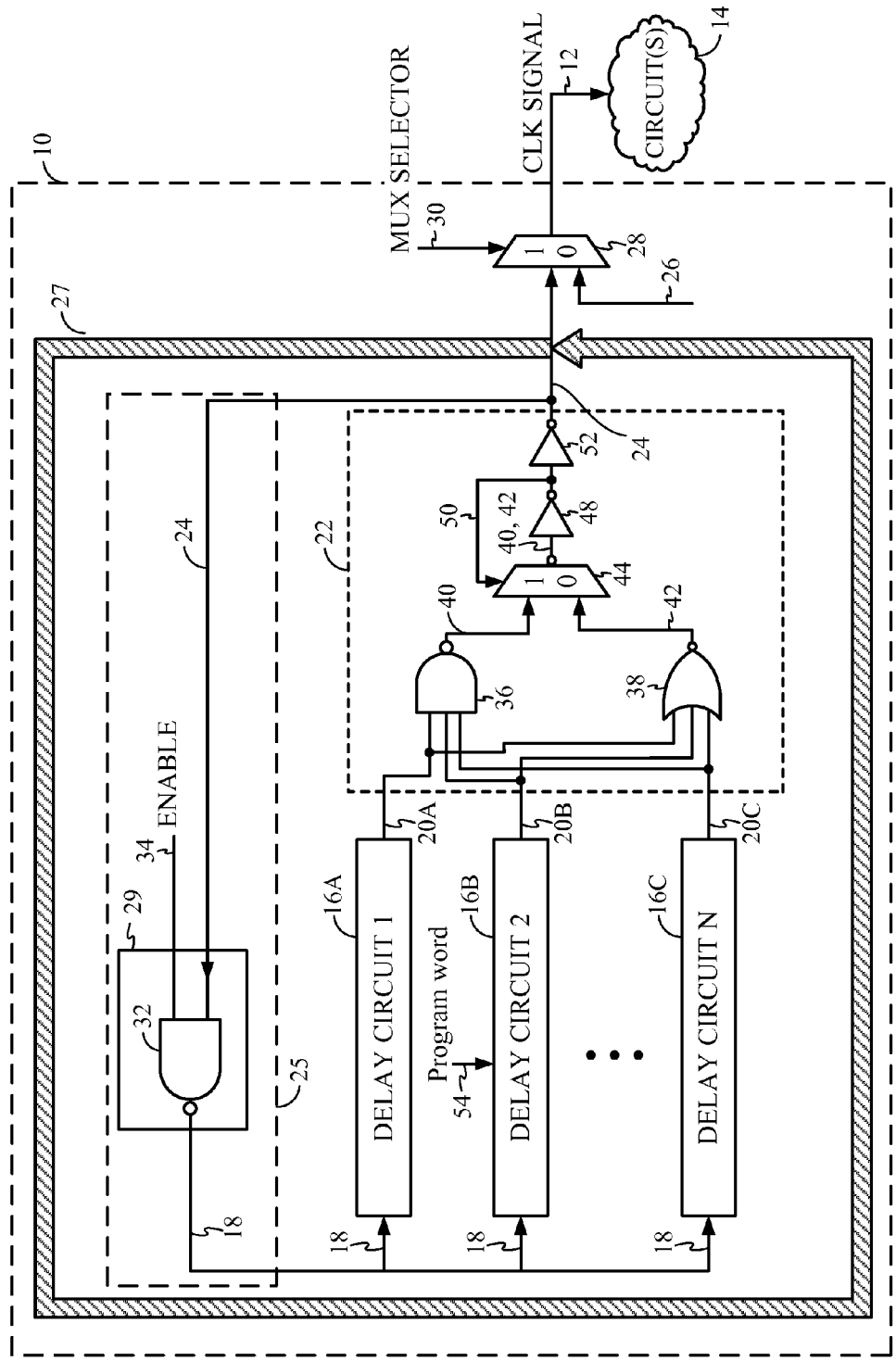
FIG. 2 is a block diagram of another exemplary adaptive clock generator.

FIG. 2 illustrates more detail regarding the adaptive clock generator 10 of FIG. 1. The components of the adaptive clock generator 10 of FIG. 1 are also present in FIG. 2. However, more detail is provided regarding the selector circuit 22 and the inverting circuit 29, although these particular configurations are not limiting to an adaptive clock generator as disclosed herein. As illustrated in FIG. 2, the inverting circuit 29 is a NAND gate 32 that receives as input the input signal 24 and an enable signal 34. Other inverting circuits or gates could be used in the inverting circuit 29 to invert the input signal 24. The enable signal 34 controls whether the oscillation loop 27 is activated and thus whether the adaptive clock generator 10 is started or stopped.

The selector circuit 22 in this embodiment is comprised of one or more latest rising edge responsive gates 36 and one or more latest falling edge responsive gates 38 that each receive the output signals 20A-20C from the delay circuits 16A-16C. The one or more latest rising edge responsive gates 36 generate the falling edge of an output signal in response to the latest rising edge of an input signal. The one or more latest falling edge responsive gates 38 generate the rising edge of an output signal in response to the latest falling edge of an input signal. In the selector circuit 22 of FIG. 2, the one or more latest rising edge responsive gates 36 are NAND gates and the one or more latest falling edge responsive gates 38 are NOR gates, both of which are configured as n-input gates, where n is the number of delay circuits 16. An output signal 40 from the latest rising edge responsive gate 36 falls in response to the slowest or latest rising edge among the output signals 20A-20C according to the delay of the input signal 18 in the delay circuits 16A-16C. An output signal 42 from the latest falling edge responsive gate 38 rises in response to the slowest or latest falling edge among the output signals 20A-20C according to the delay of the input signal 18 in the delay circuits 16A-16C. In this manner, the rising and falling edges of each pulse generated for the input signal 24 is controlled by the slowest or latest delay among the delay circuits 16A-16C. Note that one latest rising edge responsive gate 36 and one latest falling edge responsive gate 38 may be used if single gates are capable of receiving the number of output signals 20A-20C provided. If not, multiple gates coupled serially may be employed.

The output signals 40, 42 providing the slowest rising and falling edges of the output signals 20A-20C from the delay circuits 16A-16C, respectively, are input into a multiplexor 44 to select whether the output signal 40 or the output signal 42 will be used to generate the clock signal 12 on a particular iteration of the oscillation loop 27. Thus, two iterations of the oscillation loop 27 provide the rising and falling edge of one clock pulse used to generate the input signal 24 and the clock signal 12. Either the output signal 40 or the output signal 42 is provided as an input into an inverter 48. An output signal 50 from the inverter 48 is used as the multiplexor selector to the multiplexor 44. In this manner, with each iteration of the oscillation loop 27, the multiplexor 44 switches between selecting between the output signal 40 from the latest rising edge responsive gate 36 and the output signal 42 from the latest falling edge responsive gate 38 to control generation of the clock signal 12. The output signal 50 is then inverted again using inverter 52 to provide the input signal 24.

Any number of delay circuits 16 can be provided in the adaptive clock generator 10. The delay paths in each of the delay circuits 16 will all either be inverting or non-inverting so that polarity of all the delays paths are the same. The number of delay circuits 16 may be based on the number of selected delay paths in the functional circuit(s) 14, wherein each of the selected delay paths may incur varying delay depending on one or more delay variation conditions. For example, as illustrated in the exemplary flowchart in FIG. 3, the number of delay circuits 16 to be provided in the adaptive clock generator 10 may be based on a review or timing analysis of the delay paths in the functional circuit(s) 14 (block 60). The amount of delay in the delay paths may be determined to determine the critical path in the functional circuit(s) 14 (block 62). The critical path in the functional circuit(s) 14 controls the overall performance of the functional circuit(s) 14 thus limiting the maximum frequency of the clock signal 12 to sustain proper operation. However, there may be no one critical path in the functional circuit(s) 14. Different delay variation conditions can change which delay paths in the functional circuit(s) 14 become the critical path. Thus, providing a plurality of delay circuits 16 to correspond to multiple delay paths in the functional circuit(s) 14 (block 64 in FIG. 3) allows for the adaptive clock generator 10 to adaptively adjust the input signal 24 used to control the frequency of the clock signal 12 according to whatever path incurs the greatest delay depending on the delay variation conditions present at a particular time.

For example, a wire-dominated delay path may become a critical path in a functional circuit(s) 14, especially where long wires are provided between input and output terminals in the functional circuit(s) 14. A gate-dominated delay path may become a critical path based on the presence of one or more delay variation conditions, such as temperature and transistor age as examples. A diffusion capacitance-dominated delay path in the functional circuit(s) 14 employing components that involve charge and discharge due to diffusion capacitance formed between conductive portions of a component(s) and a substrate may become a critical path in the functional circuit(s) 14. As another example, a momentary change in voltage supply can also affect transistor parameters and switching delay in the functional circuit(s) 14. For example, voltage changes may cause the delay path in the functional circuit(s) 14 dominated by high threshold voltage (Hvt) devices to switch slower than under nominal voltage supply conditions as compared to nominal threshold voltage (Nvt) or low threshold voltage (Lvt) device dominated delay paths. Delay variation conditions can also cause different paths in the functional circuit(s) 14 to become more critical than others. Delay variation conditions can be any conditions that can change delay in a given delay path in a functional circuit. In addition to the examples referenced above, other examples of delay variation conditions can include variations between integrated circuit (IC) process technologies, including but not limited to nanometer (nm) process technologies, used when manufacturing functional and other circuits.

As will be discussed by example later in this application, the delay path of a delay circuit 16 may be programmable. As illustrated in the adaptive clock generator 10 in FIG. 2, a program signal 54, which may be comprised of an analog or digital signal such as a byte or word of information, for example, may be provided to the delay circuit 16 during initialization or operation to control the delay of a delay path in a delay circuit 16. Delay of a delay path in a delay circuit 16 may need to be programmed based on the timing analysis of the corresponding selected delay path in the functional circuit(s) 14 and/or adjusted to fine tune the delay since the delay provided in the delay path according to gates or other circuitry or logic may not correspond exactly to a selected delay path.

Figure 3:
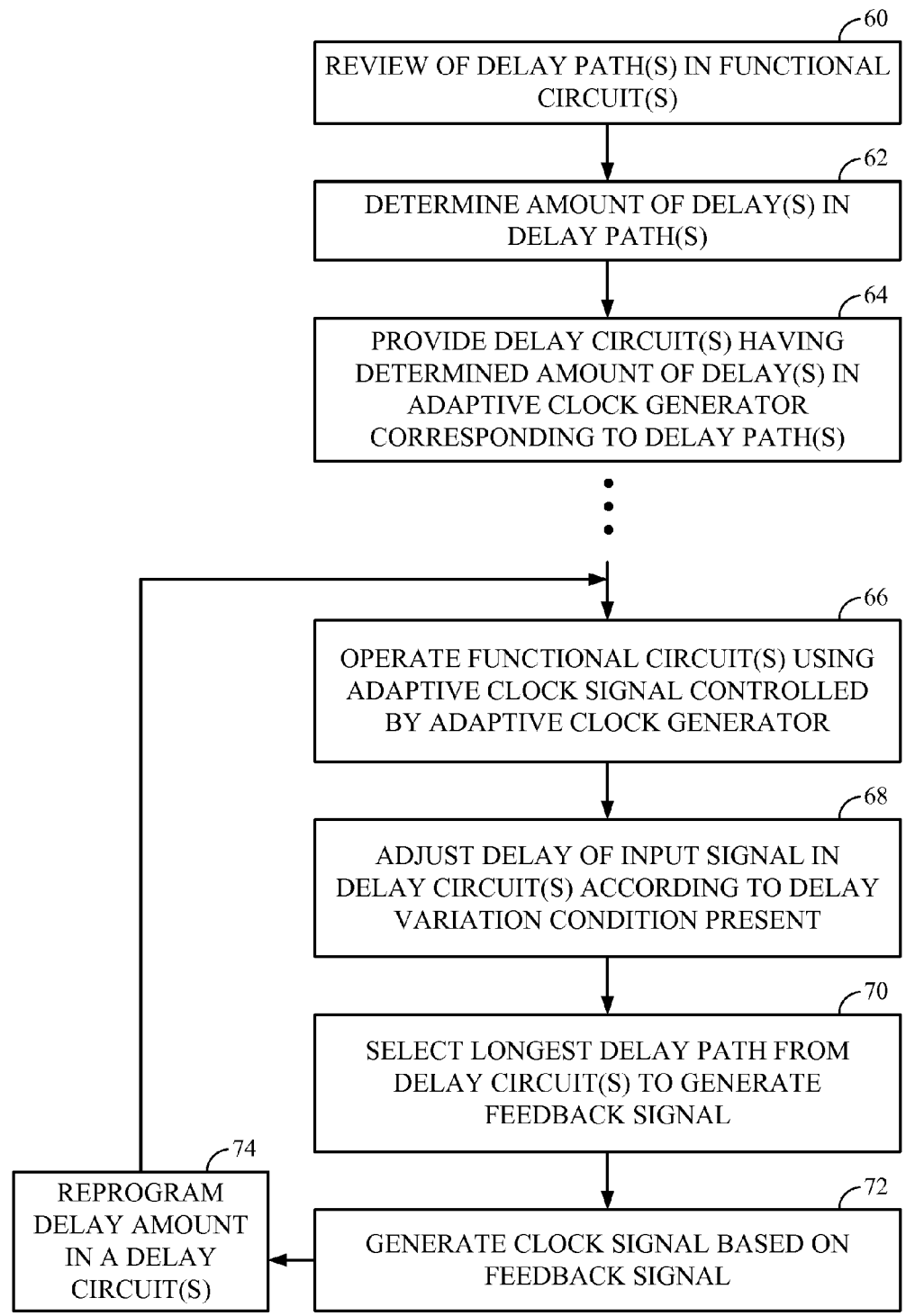
FIG. 3 is an exemplary flowchart of a delay path review(s) and a delay amount selection(s) for a delay circuit(s) provided in an adaptive clock generator and the adaptive clock generator adaptively generating a clock signal according to the delay circuits.

After the delay circuits 16 are provided according to the selected delay paths in the functional circuit(s) 14, the adaptive clock generator 10 is enabled to adaptively generate the input signal 24 to control the frequency of the clock signal 12 (block 66 in FIG. 3). During operation, the delay circuits 16 adjust the delay of the input signal 18 in the oscillation loop 27 according to the delay paths in the delay circuits 16 (block 68). The delay paths are affected by certain delay propagation variation conditions according to the delay paths designed or programmed into the delay circuits 16. In the case of multiple delay circuits 16, the adaptive clock generator 10 selects the longest delay path in the delay circuits 16 to generate the rising and falling edges of the input signal 24 (block 70). The clock signal 12 provided to the functional circuit(s) 14 is controlled and adaptively adjusted based on the input signal 24 (block 72). During operation, depending on the design of a delay circuit 16, the amount of delay in the delay path may be adjusted or reprogrammed (block 74). This adjustment or reprogramming may be based on other logic or circuitry that is designed to gauge delay adjustment in the functional circuit (s) 14. The adaptive clock generator 10 continues to operate the oscillation loop 27 in an iterative fashion until the enable signal 34 is deactivated or the power supply supplying power to the adaptive clock generator 10 is shut off or lowered to an operating voltage below a minimum threshold voltage, if any, to operate the adaptive clock generator 10.

Figure 4:
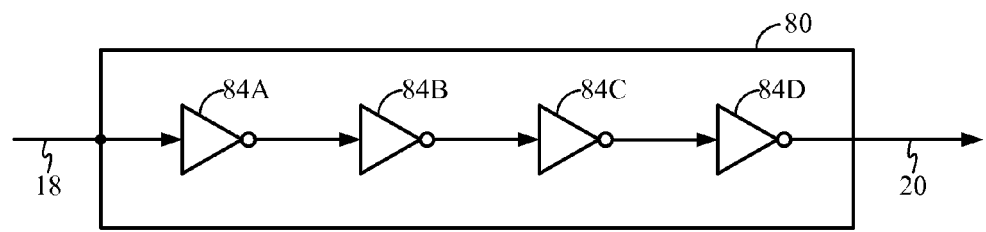
FIG. 4 is a block diagram of an exemplary gate-dominated delay circuit that may be employed as a delay circuit in an adaptive clock generator.

As previously discussed above, the delay circuits 16 can be designed to provide different types of delay paths to correspond to various types of selected delay paths in a functional circuit(s) 14. For example, FIG. 4 illustrates an exemplary gate-dominated delay circuit 80 that provides a gate-dominated delay path. A gate-dominated delay path is a delay path that varies primarily by the propagation delay in switching of logic gates. The propagation delay is affected by gate capacitance. Because logic gates are comprised of transistors, delay variation conditions that affect propagation delay in switching in transistors affect the amount of delay in a gate-dominated delay path, including the gate-dominated delay path in the delay circuit 16 of FIG. 4. As illustrated, four inverter gates 84A-84D are coupled serially between the input signal 18 and the output signal 20, as illustrated by example in the adaptive clock generator 10 in FIGS. 1 and 3. However, any type and/or number gates may be used. The type and number of gates used is a function of the gates in a selected gate-dominated delay path of which the gate-dominated delay circuit is designed to correspond. In this example, the gate-dominated delay circuit 80 is non-programmable, meaning that the amount of delay provided by the gate-dominated delay path cannot be adjusted other than by delay variation conditions. Thus, the amount of delay in the gate-dominated delay path cannot be programmed to provide adjustments. However, it may be desirable to allow for the amount of delay to be programmed in case the type and number of gates provided in the gate-dominated delay circuit 80 do not provide the exact amount of delay during operation as expected during design.

Figure 5:
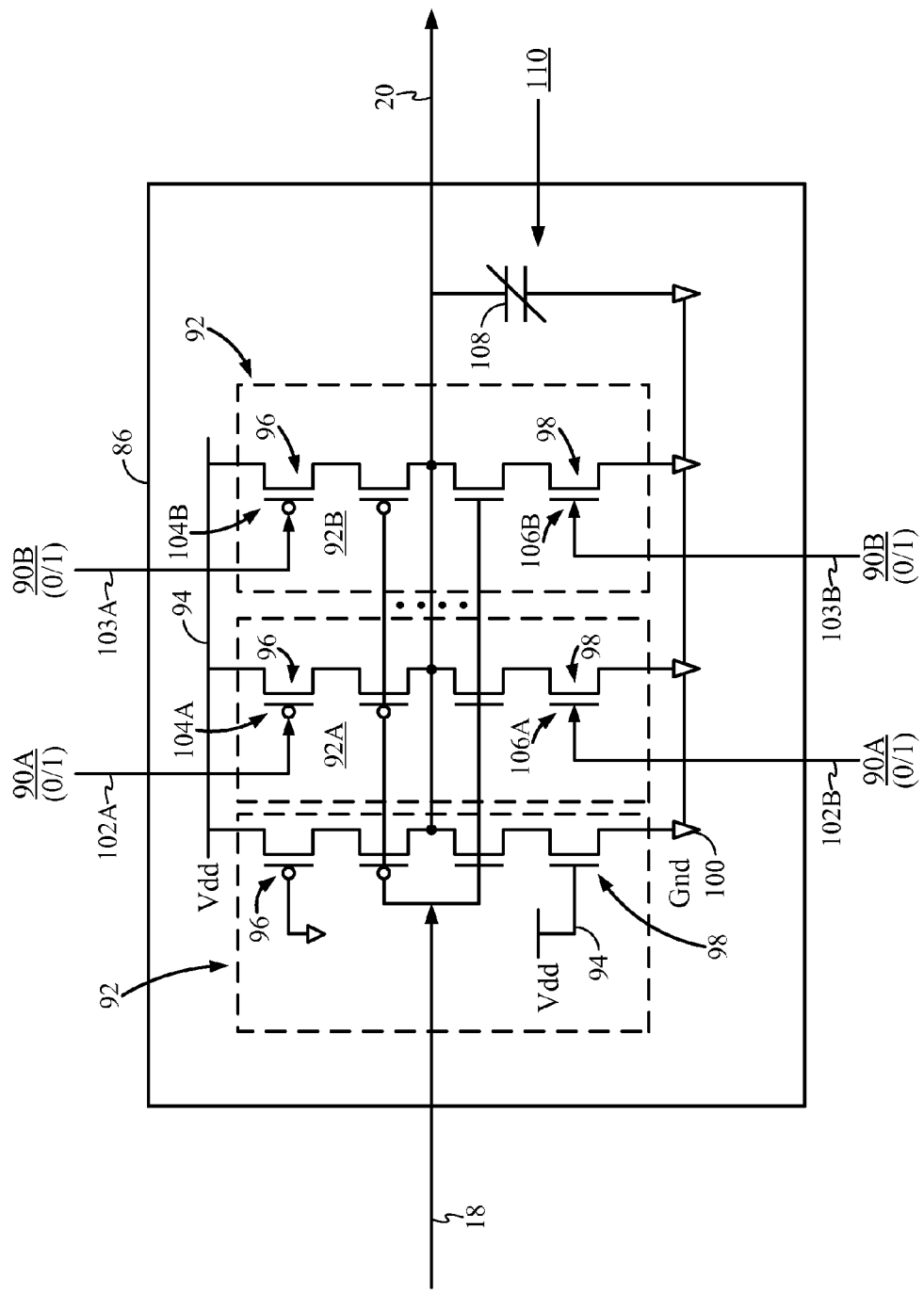
FIG. 5 is a block diagram of an exemplary programmable gate-dominated delay circuit that may be employed in an adaptive clock generator.

In this regard, FIG. 5 illustrates an example of a programmable or adjustable gate-dominated delay circuit 86. In this gate-dominated delay circuit 86, a delay path is dominated by gate logic. However, in this embodiment, the drive strength provided by the gate-dominated delay circuit 86 to the delay path can be controlled via a program signal 90 to control the amount of delay provided in the delay path. As illustrated in the gate-dominated delay circuit 86 of FIG. 5, a group of inverters 92 are provided and coupled between the input signal 18 and the output signal 20 in the oscillation loop 27 (shown in FIGS. 1 and 3). Additional transistors 96, 98 are provided between Vdd rail 94 and the P-type metal oxide semiconductor (MOS) (PMOS) transistors of each inverter 92, and the ground (Gnd) rail 100 and the N-type MOS (NMOS) transistors of each inverter 92, respectively. One or more of the inverters 92 provided in the gate-dominated delay circuit 86 are programmable (illustrated in FIG. 5 as multiple programmable inverters 92A, 92B). The programmable inverters 92A, 92B can be controlled to control an amount of delay provided to the input signal 18 in the delay path. The drive strength of the gate-dominated delay circuit 86 can be controlled by controlling whether the programmable inverters 92A, 92B contribute to the drive strength. Increasing drive strength decreases the amount of delay in the delay path. Decreasing drive strength increases the amount of delay in the delay path.

As illustrated in FIG. 5, two programming lines 102A, 102B, 103A, 103B are provided for each of the programmable inverters 92A, 92B. Each programming line 102A, 102B, 103A, 103B carries the programming setting 90A, 90B to control whether each programmable inverter 92A, 92B contributes to the drive strength of the gate-dominated delay circuit 86. For example, if the programming line 102A is set to a logical '0' value (e.g., 0 Volts) to turn on a PMOS transistor 104A, and the programming line 102B is set to a logical '1' value (e.g., 1 Volts) to turn on an NMOS transistor 106A, the programmable inverter 92A is activated and contributes to the drive strength of the gate-dominated delay circuit 86 to decrease the amount of delay in the delay path. The same applies to the programmable inverter 92B. If the programmable inverters 92A, 92B are deactivated (i.e., programming lines 102A, 103A are set to logical '1' and programming lines 102B, 103B are set to logical '0'), the programmable inverters 92A, 92B do not contribute to the drive strength of the gate-dominated delay circuit 86 thereby increasing the amount of delay in the delay path. The programming lines 102A, 102B and 103A, 103B may be set by a two (2) bit program setting word, respectively. Alternatively, the programmable lines 102A, 102B, 103A, 104B may be set by one, four (4) bit program setting word. Any other desired arrangement can be provided.

The ability to vary the amount of delay in the delay path is related to the number of programmable inverters provided. For example, a default setting of the gate-dominated delay circuit 86 may be for the programmable inverter 92A to be activated and the programmable inverter 92B to be deactivated. This default setting provides a default amount of delay in the delay path. To increase the amount of delay in the delay path from the default delay, the programmable inverter 92A can be controlled via program setting 90A to be deactivated to decrease drive strength. To decrease the amount of delay in the delay path from the default delay setting, programmable inverters 92A, 92B can be controlled via program settings 90A, 90B to both be activated to increase drive strength. Any number of programmable inverters may be provided in a gate-dominated delay circuit 86 depending on the number of possible delay variations desired.

Finer resolution delay programming may also be desired in the gate-dominated delay circuit 86. In this regard, the gate-dominated delay circuit 86 of FIG. 5 may also include a variable load adjustment component 108 on the output signal 20 to allow fine tuning of the amount of delay in the delay path. In this embodiment, the variable load adjustment component 108 is a variable capacitor whose capacitance is controlled by a load adjustment setting 110. An increase in load capacitance increases the capacitance of the gate-dominated delay circuit 86 and the delay of the delay path according to a resistance-capacitance (RC) network model. In the same regard, a decrease in load capacitance decreases the delay of the delay path. In this manner, fine adjustment of the delay of the delay path in the gate-dominated delay circuit 86 is possible.

Figure 6:
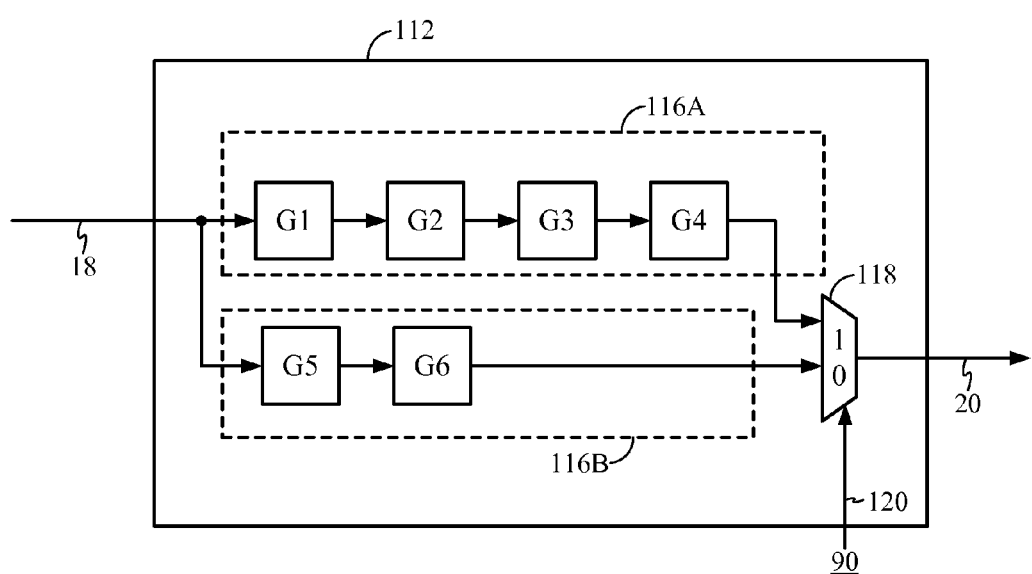
FIG. 6 is a block diagram of another exemplary programmable gate-dominated delay circuit that may be employed as a delay circuit in an adaptive clock generator.

FIG. 6 illustrates another example of a programmable gate-dominated delay circuit 112 that may be used in the adaptive clock generators described above. In this example, first and second delay paths are provided by two parallel series of gates 116A, 116B. The first delay path comprised of gates G1-G4 may have a greater combined propagation delay than the second delay path comprised of gates G5-G6 depending on the type of gates provided in the first and second delay paths.

Further, the propagation delay in the gates G1-G6 may be determined according to whether the gates G1-G6 are Hvt, Nvt, or Lvt devices. A multiplexor 118 is provided to select one of the first and second delay paths as the delay path to control the delay of the input signal 18. Thus, a multiplexor selector 120 allows programmability of the total delay of the gate-dominated delay circuit 112 by selecting the total delay to either the first delay path or the second delay path. Note that any number of delay paths may be provided in the gate-dominated delay circuit 112, wherein one of the delay paths is selected to control the amount of delay in the gate-dominated delay circuit 112. A programmable load adjustment component like provided in FIG. 5 could also be provided in the gate-dominated delay circuit 112 and coupled to the output signal 20 in the gate-dominated delay circuit 112 of FIG. 6, although not illustrated in this embodiment.

Figure 7:
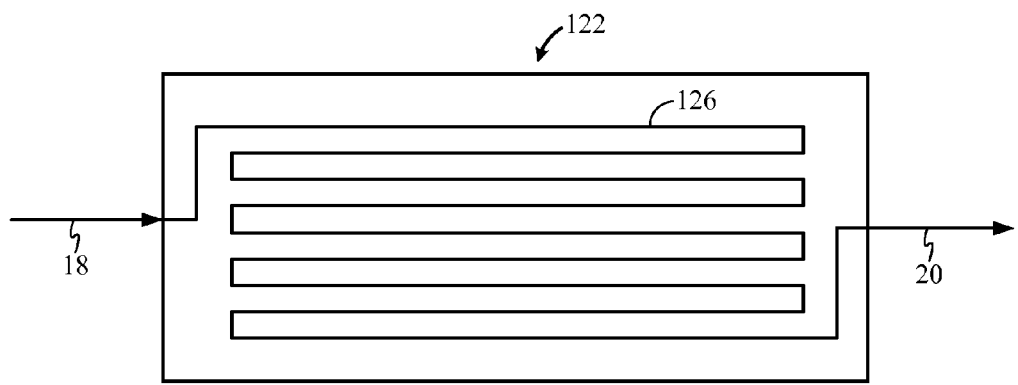
FIG. 7 is a block diagram of an exemplary wire-dominated delay circuit that may be employed as a delay circuit in an adaptive clock generator.

FIG. 7 is an example of a wire-dominated delay circuit 122 that may be provided as a delay circuit in an adaptive clock generator, including those previously described, if the delay in the selected delay path in a functional circuit is wire-dominated. A wire-dominated delay path is one in which the delay in the delay path is primarily dominated by the RC delay of a wire or wires in the delay path. For example, the speed of a cache functional circuit may be dominated by RC delays caused by wires rather than gate propagation delays. As illustrated in FIG. 7, a delay path of the wire-dominated delay circuit 122 is comprised of a wire 126 of a given length that is provided to simulate the RC response of a wire-dominated delay of a selected delay path in the functional circuit(s) receiving the clock signal 12. The wire 126 may also be provided in a coiled, serpentine, or zigzag arrangement to provide the desired length of wire within the wire-dominated delay circuit 122 to mimic a wire-dominated delay path in the functional circuit(s) 14. The input signal 18 from the oscillation loop 27 travels through the wire 126 eventually providing the output signal 20 after a delay controlled by the delay path.

Figure 8:
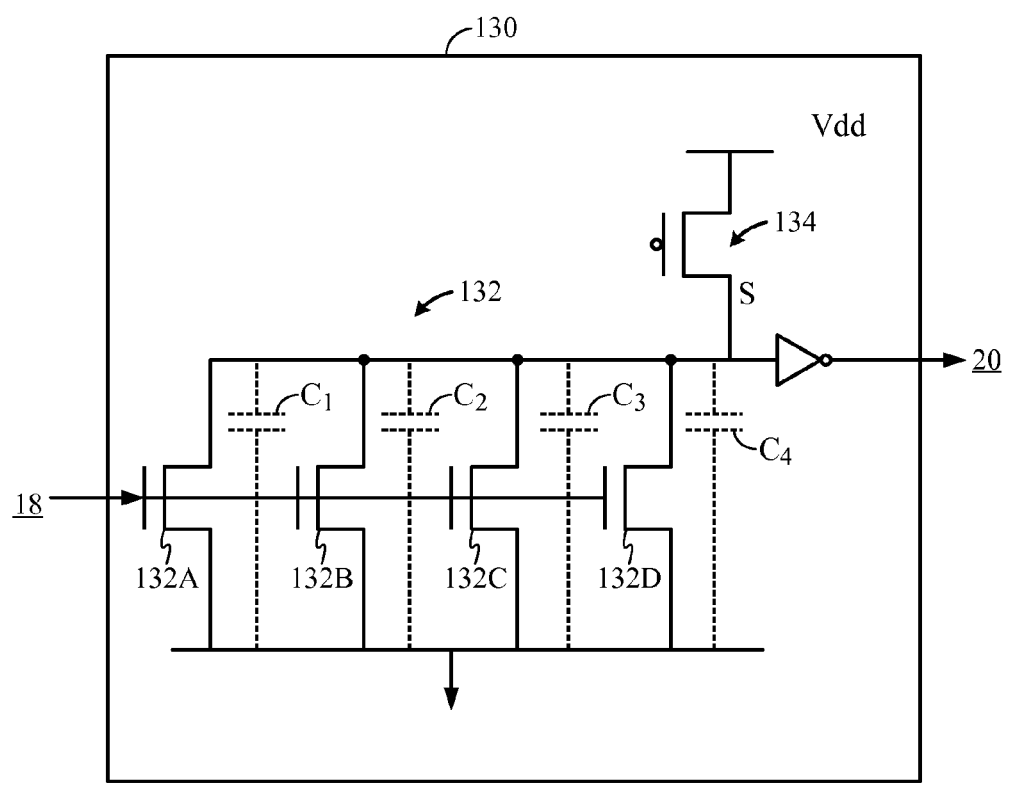
FIG. 8 is a block diagram of an exemplary diffusion capacitance-dominated delay circuit that may be employed as a delay circuit in an adaptive clock generator.

FIG. 8 illustrates another example of a delay circuit that may be employed as a delay circuit in an adaptive clock generator, including those previously described. In this embodiment, the delay circuit is a diffusion capacitance-dominated delay circuit 130. Diffusion capacitance can dominate the delay in a functional circuit. Diffusion capacitance can be created when one or more conductive portions of a component are located adjacent one or more conductive portions of a substrate when the component is mounted to a functional circuit, including the functional circuit(s) 14. The adjacent conductive portions act like a parallel-plate capacitor. The charge stored therein and thus the RC characteristic of the path containing the diffusion-capacitance can change in response to variation conditions. If diffusion-capacitance is included in a critical path of the functional circuit(s) 14, the amount of delay in the functional circuit(s) 14 can be diffusion-capacitance dominated.

In this regard, as illustrated in FIG. 8, the diffusion capacitance-dominated delay circuit 130 receives the input signal 18 and provides a delay path. The delay path controls the amount of delay in the input signal 18 propagating to the output signal 20. In this embodiment, a number of N-type field effect transistors (NFETs) 132A-D are included and coupled together in parallel in the diffusion capacitance-dominated delay circuit 130. Each NFET 132A-D provides a capacitance load ($C_1$-$C_4$) to mimic a diffusion capacitance in a selected delay path in the functional circuit(s) 14. Each of the capacitance load $C_1$-$C_4$ add together in their parallel arrangement to provide a total capacitance load (i.e., $C_1+C_2+C_3+C_4$) on the NFET 132. A change in the power supply (i.e., Vdd) and/or change in another variation condition can cause a change in the amount of time to either charge or discharge the capacitance provided in the diffusion-capacitance dominated delay circuit 130, which in turn varies the amount of delay in the delay path. The diffusion-capacitance dominated delay circuit 130 is designed to attempt to mimic the amount of delay in a selected diffusion capacitance-dominated delay path in the functional circuit(s) 14.

The adaptive clock generator and related methods described herein may be used to control a clock signal provided in any circuit or system, including but not limited to a synchronous digital circuit, central processing unit (CPU) system, and a memory circuit or system. If employed in a memory circuit or system, the memory circuit or system may employ any type of memory. Examples include, without limitation, static random access memory (RAM) (SRAM), dynamic RAM (DRAM), synchronous DRAM (SDRAM), data-double-rate (DDR) SDRAM, data-double-rate-two (DDR2) SDRAM, data-double-rate-three (DDR3) SDRAM, Mobile DDR (MDDR) SDRAM, low-power (LP) DDR SDRAM, and LP DDR2 SDRAM. Any of the components of a memory circuit or system receiving a clock signal from the adaptive clock generator may be provided in any voltage domain among a plurality of voltage domains as long as the memory is powered by a voltage domain providing a sufficient voltage level to keep the memory cell functional, if required by the technology and/or design of the memory.

The adaptive clock generator according to the designs and methods discussed herein may be included or integrated in a semiconductor die, integrated circuit, and/or device, including an electronic device and/or processor-based device or system. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

Figure 9:
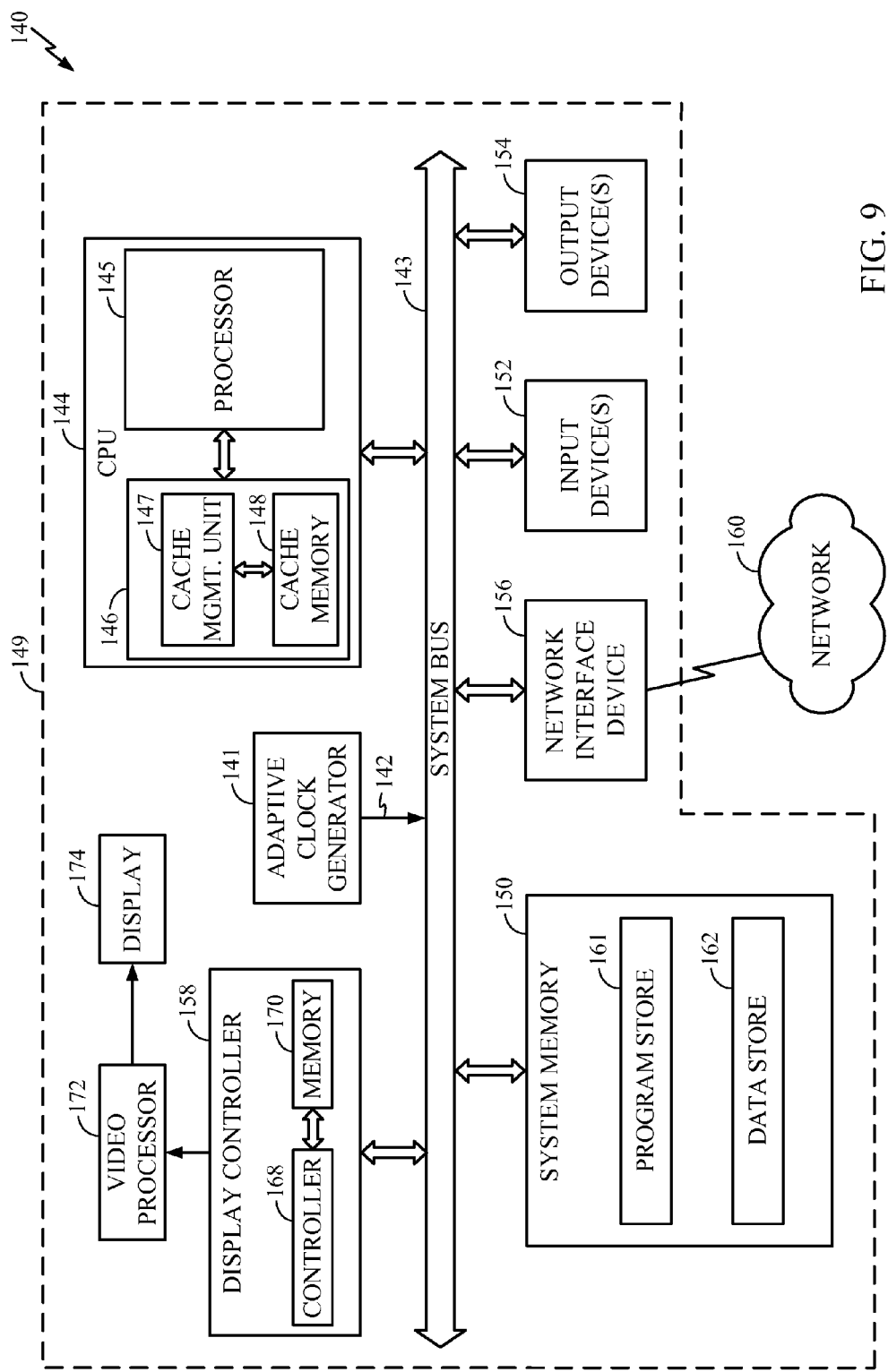
FIG. 9 is a block diagram of an exemplary central processing unit (CPU) functional circuit and related system, wherein a system bus clock signal is provided by an adaptive clock generator.

FIG. 9 illustrates a processor-based system 140 that may employ an adaptive clock generator 141 and related circuits described above. The adaptive clock generator 141 may be used to provide a clock signal 142 for a system bus 143, wherein the clock signal 142 is distributed to various synchronous components in the processor-based system 140. The processor-based system 140 may be included in an electronic device 149. In this example, the processor-based system 140 includes a central processing unit (CPU) 144 that includes a processor 145 and an integrated cache system 146. The cache system 146 includes a cache management unit 147 that controls access to a cache memory 148 accessible to the processor 145 for rapid access to temporary storage for frequently accessed data. The CPU 144 is coupled to the system bus 143, which interconnects the other devices included in the processor-based system 140. As is well known, the CPU 144 communicates with these other devices by exchanging address, control, and data information over the system bus 143. These devices may include any types of devices. As illustrated in FIG. 9, these devices may include system memory 150, one or more input devices 152, one or more output devices 154, a network interface device 156, and a display controller 158, as examples.

The one or more input devices 152 may include any type of input device, including but not limited to input keys, switches, voice processors, etc. The one or more output devices 154 may include any type of output device, including but not limited to audio, video, other visual indicators, etc. The network interface device 156 may be any device configured to allow exchange of data to and from a network 160. The network 160 may be any type of network, including but not limited to a wired or wireless network, private or public network, a local area network (LAN), a wide local area network (WLAN), and the Internet. The network interface device 156 may support any type of communication protocol desired.

The CPU 144 may also access system memory 150 over the system bus 143. The system memory 150 may include circuits and methods previously described above to access the system memory 150. The system memory 150 may include static memory and/or dynamic memory. The system memory 150 may include a program store 161 and a data store 162 for the CPU 144. The CPU 144 may also access the display controller 158 over the system bus 143 to control information sent to a display 174. The display controller 158 may include a memory controller 168 and memory 170 to store data to be sent to the display 174 in response to communications with the CPU 144. The display controller 158 sends information to the display 174 to be displayed via a video processor 172, which processes the information to be displayed into a format suitable for the display 174. The display 174 may include any type of display, including but not limited to a cathode ray tube (CRT), a liquid crystal display (LCD), a plasma display, etc.

Those of skill in the art would further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium is coupled to the processor such that a processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A clock generator, comprising:
   at least one delay circuit adapted to receive an input signal and delay the input signal by an amount relating to at least one preselected delay path of a functional circuit to produce an output signal; and
   a feedback circuit coupled to the at least one delay circuit and responsive to the output signal, wherein the feedback circuit is adapted to generate the input signal.

2. The clock generator of claim 1, wherein the output signal is coupled to a clock signal input of the functional circuit.

3. The clock generator of claim 1, wherein the at least one delay circuit comprises at least one delay path comprised from the group consisting of a gate-dominated delay path, a wire-dominated delay path, and a diffusion capacitance-dominated delay path.

4. The clock generator of claim 1, wherein the at least one delay circuit is configured to receive at least one program signal to program the amount of delay in at least one delay path of the at least one delay circuit.

5. The clock generator of claim 4, wherein the at least one delay circuit is comprised of a plurality of delay circuits, wherein the program signal is configured to include or bypass one or more circuits in the plurality of delay circuits to program the amount of the delay in the at least one delay path in the at least one delay circuit.

6. The clock generator of claim 4, wherein the at least one delay circuit comprises a plurality of delay paths, wherein the program signal is configured to select one of the plurality of delay paths as the delay path for the at least one delay circuit.

7. The clock generator of claim 1, wherein the at least one delay circuit adapted to receive an input signal and delay the input signal by an amount relating to at least one preselected delay path of a functional circuit is comprised of a plurality of delay circuits each adapted to receive the input signal and delay the input signal by an amount relating to a plurality of preselected delay paths of the functional circuit.

8. The clock generator of claim 7, wherein the output signal is produced according to the longest delay among the plurality of delay circuits.

9. The clock generator of claim 1, wherein the feedback circuit comprises:
at least one latest rising edge responsive gate and at least one latest falling edge responsive gate, both responsive to the output signal; and
a selector circuit adapted to generate the input signal based on an alternating selection of an output signal from the at least one latest rising edge responsive gate and an output signal from the at least one latest falling edge responsive gate.

10. The clock generator of claim 1, further comprising a selector circuit coupled to the at least one delay circuit and the feedback circuit and adapted to couple one of a plurality of delay paths in the at least one delay circuit to the feedback circuit.

11. The clock generator of claim 1 integrated in at least one semiconductor die.

12. The clock generator of claim 1, further comprising a device selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (MID) player, and a portable digital video player, into which the clock generator is integrated.

13. A clock generator, comprising:
a means for receiving an input signal and delaying the input signal by an amount relating to at least one preselected delay path of a functional circuit and for producing an output signal; and
a means coupled to the means for receiving an input signal and responsive to the output signal for generating the input signal.

14. A method of generating a clock signal, comprising:
receiving an input signal in at least one delay circuit;
delaying the input signal by an amount relating to at least one preselected delay path in a functional circuit;
generating a clock signal as a result of delaying the input signal; and
generating the input signal using a feedback circuit coupled to the at least one delay circuit and responsive to the clock signal.

15. The method of claim 14, further comprising generating a clock signal for the functional circuit based on the input signal.

16. The method of claim 14, further comprising providing a program signal to the at least one delay circuit to program the amount of delay in at least one delay path of the at least one delay circuit.

17. The method of claim 14, further comprising providing a program signal to the at least one delay circuit to control whether one or more delay paths in the at least one delay circuit are bypassed from or included in the at least one delay circuit.

18. The method of claim 14, wherein delaying the input signal comprises delaying the input signal according to a selected delay path among a plurality of delay paths in the at least one delay circuit.

19. The method of claim 14, wherein receiving the input signal comprises receiving the input signal in a plurality of delay circuits; and
delaying the input signal by an amount relating to at least one preselected delay path in a functional circuit comprises delaying the input signal by an amount relating to the plurality of preselected delay paths in the functional circuit.

20. The method of claim 19, comprising generating the clock signal according to the longest delay among the plurality of delay circuits.

21. A circuit, comprising:
a clock generator, comprising:
at least one delay circuit adapted to receive an input signal and delay the input signal by an amount relating to at least one preselected delay path of a functional circuit to produce an output signal; and
a feedback circuit coupled to the at least one delay circuit and responsive to the output signal, wherein the feedback circuit is adapted to generate the input signal; and
wherein the functional circuit is adapted to receive a clock signal based on the input signal to control timing of one or more synchronous functions.

22. The circuit of claim 21, further comprising a device selected from the group consisting of a set top box, an entertainment unit, a navigation device, a communications device, a personal digital assistant (PDA), a fixed location data unit, a moble location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the circuit is integrated.

23. A method of providing a clock generator, comprising:
reviewing a plurality of preselected delay paths in a functional circuit;
determining an amount of delay in the plurality of preselected delay paths;
providing a plurality of delay circuits in a clock generator each configured to correspond to the amount of delay in one of the plurality of preselected delay and
configuring the plurality of delay circuits to:
delay an input signal by an amount relating to the longest delay among the plurality of preselected delay paths;
generate an output signal for clocking at least a portion of the functional circuit as a result of delaying the input signal; and
generate the input signal using a feedback circuit coupled to the plurality of delay circuits and responsive to the output signal.

\* \* \* \* \*